US005138402A

United States Patent [19]

Tsukamoto et al.

[11] Patent Number: 5,138,402

[45] Date of Patent: Aug. 11, 1992

[54] SEMICONDUCTOR ELECTRON EMITTING DEVICE

[75] Inventors: Takeo Tsukamoto, Atsugi; Toshihiko Takeda, Tokyo; Haruhito Ono, Ashigara; Nobuo Watanabe, Atsugi; Masahiko Okunuki, Tokyo, all of Japan

[73] Assignee: Canon Kabushiki Kaisha, Tokyo, Japan

[21] Appl. No.: 807,613

[22] Filed: Dec. 13, 1991

Related U.S. Application Data

[63] Continuation of Ser. No. 313,547, Feb. 22, 1989, abandoned.

[30] Foreign Application Priority Data

Feb. 27, 1988 [JP] Japan .................................. 63-45471

[51] Int. Cl.[5] ..................... H01L 29/48; H01L 29/90; H01L 23/48

[52] U.S. Cl. ........................................ 357/15; 357/13; 357/68; 357/91

[58] Field of Search ......................... 357/15, 13, 91, 68

[56] References Cited

U.S. PATENT DOCUMENTS 4,259,678 3/1981 Van Gorkom ........................ 357/13

4,303,930 12/1981 Van Gorkom ........................ 357/13

FOREIGN PATENT DOCUMENTS 0150885 8/1985 European Pat. Off. .

119131 5/1988 Japan .

OTHER PUBLICATIONS

*Philips Technical Review*, vol. 43, No. 3, Jan. 1987, Van Gorkom, G., et al. "Silicon Cold Cathodes", pp. 49-56.

*Applied Physics Letters, vol. 13, No. 7, Oct. 1, 1968, Williams, R., et al. "Electron Emission From The Schottky Barrier Structure ZnS: Pt: Cs", pp. 231-233.*

*Primary Examiner*—Mark V. Prenty

*Attorney, Agent, or Firm*—Fitzpatrick, Cella Harper & Scinto

[57] ABSTRACT

A semiconductor electron emitting device comprising a Schottky electrode and a p type semiconductor. The Schottky electrode is disposed on the p type semiconductor and defines a junction formed therebetween. The p type semiconductor has an impurity concentration within a predetermined range adapted for causing an avalanche breakdown responsive to a reverse biasing voltage applied between said p type semiconductor and said Schottky electrode. Electrons are emitted from the Schottky electrode in response to the application of the reverse bias voltage.

16 Claims, 3 Drawing Sheets

SEMICONDUCTOR ELECTRON EMITTING DEVICE

This application is a continuation of application Ser. No. 07/313,547 filed Feb. 22,1989, and now abandoned.

BACKGROUND OF THE INVENTION

1. Field of the Invention

The present invention relates to a semiconductor electron emitting device and, more particularly, to a semiconductor electron emitting device in which an avalanche amplification is caused and electrons are changed to hot electrons and then emitted.

2. Related Background Art

Hitherto, among semiconductor electron emitting devices, there have been known devices using the avalanche amplification as disclosed in U.S. Pat. Nos. 4,259,678 and 4,303,930. Such devices are constructed in the following manner. A p type semiconductor layer and an n type semiconductor layer are formed so as to be come into contact with each other, thereby forming a diode structure. By applying a reverse bias voltage between both electrodes of the diode, the avalanche amplification is caused and the electrons are changed to the hot electrons. The electrons are emitted from the surface of the n type semiconductor layer in which a work function is reduced by depositing cesium or the like onto the surface of the n type semiconductor layer.

In the above conventional devices, to reduce the work function of the electron emitting section, cesium and cesium-oxygen compound are formed on the surface of the electron emitting section. However, since the cesium material is chemically extremely active, there are problems such that (1) the stable operation is performed only when the cesium material is used at a super high vacuum (to $10^{-7}$ Torr or more), (2) the life changes depending on a degree of vacuum, (3) the efficiency changes depending on a degree of vacuum, (4) and the like. On the other hand, the hot electrons generated at the pn interface are dispersed and lose the energy when they pass through the n type semiconductor layer. Therefore, it is necessary to very thinnly form the n type semiconductor layer (for instance, 200 Å or less). However, many problems on the semiconductor manufacturing process exist in the case of uniformly forming such an extremely thin n type semiconductor layer at a high concentration and less defect. It is difficult to stably manufacture the device.

SUMMARY OF THE INVENTION

It is an object of the present invention to solve the problems which are caused due to the material which reduces the work function and the realization of a thin semiconductor layer. For this purpose, the hot electrons are generated by using the avalanche of the Schottky junction. That is, an impurity concentration of p type semiconductor to which a Schottky electrode is joined is set to a value within such a concentration range as to cause the avalanche breakdown. A voltage so as to reversely bias the junction between the Schottky electrode and the p type semiconductor is applied and the avalanche amplification is caused, thereby allowing electrons to be stably emitted from the surface of the Schottky electrode.

Therefore, the Schottky electrode is used as a low work function material and the work function of the electron emission surface decreases, so that the electrons can be stably emitted. In addition, the requirement to make the semiconductor layer thin is also lightened.

The practical operation of the semiconductor electron emitting device of the invention will now be described hereinbelow with reference to an energy band diagram.

FIG. 4 is an energy band diagram of the semiconductor surface in the semiconductor electron emitting device of the invention.

The example of using the low work function material as a composing material of the Schottky electrode will now be described.

As shown in FIG. 4, by reversely biasing the junction between a p type semiconductor (in the diagram, p denotes a p type semiconductor portion) and a low work function material (in the diagram, T indicates a low work function material portion), a vacuum level $E_{VAC}$ can be set to an energy level lower than a conduction band $E_C$ of the p type semiconductor and a large energy difference $\Delta E$ can be derived. By causing the avalanche amplification in such a state, a number of electrons which were the monority carriers in the p type semiconductor can be produced and an emitting efficiency of the electrons can be raised. On the other hand, since the electric field in a depletion layer gives an energy to the electrons, the electrons are changed to the hot electrons and a kinetic energy increases larger than the temperature of lattice system. Therefore, the electrons having a potential larger than the work function of the surface can be emitted out of the surface without losing the large energy due to the diffusion.

As a semiconductor material which is used for the semiconductor electron emitting device of the invention, it is possible to use the material such as Si, Ge, GaAs, GaP, GaAlP, GaAsP, GaAlAs, SiC, BP, etc. However, any semiconductor material which can form a p type semiconductor can be used. In the case of the indirect transition type semiconductor having a large band gap E, the electron emitting efficiency is good.

The impurity concentration of the semiconductor which is used is set to a value in a concentration range such as to cause the avalanche breakdown. In such a case, by using the semiconductor at a limited concentration such that the tunnel effect dominates the breakdown characteristics, the maximum efficiency at which the avalanche breakdown contributes to change the electrons to the hot electrons is obtained. Therefore, the impurities must be doped at a concentration which is not larger than a concentration such as to cause the tunnel breakdown.

The Schottky electrode material which is used for the semiconductor electron emitting device of the invention must be the material which clearly shows the Schottky characteristic to the p type semiconductor. In general, a linear relation is satisfied between a work function $\phi_{Wk}$ and a Schottky barrier height $\phi_{Bn}$ to an n type semiconductor (see equation 76(b) on page 274 of "Physics of Semiconductor Devices" by S. M. Sze.). In the case of Si, $\phi_{Bn}=0.235$ and $\phi_{Wk}=0.55$. In the case of the other semiconductor materials, the value of $\phi_{Bn}$ also similarly decreases as the work function is reduced. On the other hand, in general, there is the following relation between the Schottky barriers $\phi_{Bp}$ and $\phi_{Bn}$ to the p type semiconductor.

$$\phi_{Bp} + \phi_{Bn} = \frac{1}{q} E_g$$

Therefore, the Schottky barrier to the p type semiconductor becomes as follows.

$$\phi_{Bp} = \frac{1}{q} E_g - \phi_{Bn}$$

As will be obviously understood from the above equation, by using the low work function material, a good Schottky diode to the p type semiconductor can be produced. As such a low work function material, there have been known metals of the 1A, 2A, and 3A groups and of the lanthanoids system, silicides of the 1A, 2A, and 3A groups and of the lanthanoids system, borides of the 1A, 2A, and 3A groups and of the lanthanoids system, carbides of the 1A, 2A, and 3A groups and of the lanthanoids system, and the like. The work functions of those materials are set to 1.5 to 4V. All of them can be used as good Schottky electrode materials for the p type semiconductor.

By using the foregoing semiconductor material, semiconductor concentration, and Schottky electrode material, the good semiconductor electron emitting device of the Schottky type can be manufactured.

DETAILED DESCRIPTION OF THE PREFERRED EMBODIMENTS

An embodiment of the present invention will be described in detail hereinbelow with reference to the drawings.

Figure 1A:
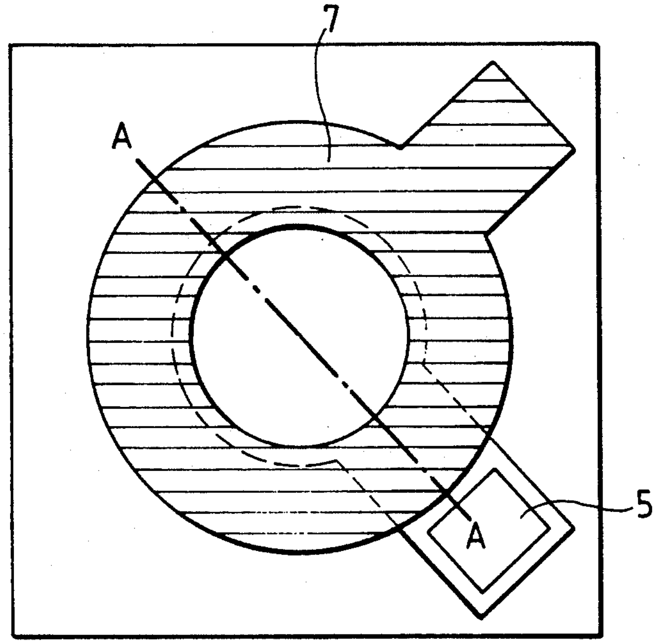
FIGS. 1A and 1B are schematic arrangement diagrams of the first embodiment of a semiconductor electron emitting device of the present invention.
Figure 1B:
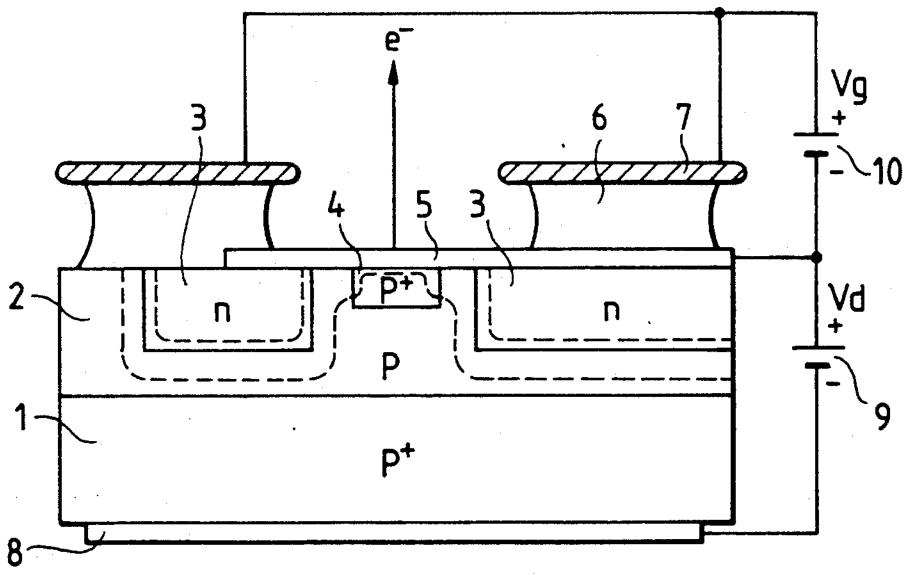

FIGS. 1A and 1B are schematic arrangement diagrams of the first embodiment of a semiconductor electron emitting device of the invention. FIG. 1A is a plan view and FIG. 1B is a cross sectional view taken along the line A—A in FIG. 1A.

As shown in FIGS. 1A and 1B, a p type semiconductor layer (hereinafter, referred to as a p layer) 2 having an impurity concentration of $3\times10^{16}$ ($cm^{-3}$) is epitaxially grown and formed on a p type semiconductor substrate 1 (in the embodiment, Si (100)) by a CVD process. A photoresist is opened at a predetermined position by a resist process of the photo lithography. P ions are implanted through this opening and annealed to thereby form an n type semiconductor region 3. Similarly, a photoresist is opened at a predetermined position by the resist process. B ions are implanted through this opening and annealed to thereby form a p type semiconductor region 4.

Next, Gd ($\phi_{Wk}$=3.1V) is evaporation deposited as a low work function material serving as a Schottky electrode 5 until a thickness of 100 Å and is thermally processed at 350° C. for ten minutes, thereby forming $GdSi_2$. The barrier height $\phi_{Bp}$ at this time is 0.7V and a good Schottky diode is derived. Further, $SiO_2$ and polysilicone are deposited. An opening portion to emit electrons is formed by using the photo lithography technique. An extraction electrode 7 is formed onto the Schottky electrode 5 through an $SiO_2$ layer 6 by a selective etching process. Reference numeral 8 denotes an electrode for ohmic contact which is formed by evaporation depositing Al onto the opposite surface of the p type semiconductor substrate 1. Reference numeral 9 denotes a power supply to apply a reverse bias voltage $V_d$ to the portion between the Schottky electrode 5 and the electrode 8. Reference numeral 10 denotes a power supply to apply a voltage $V_g$ to the portion between the Schottky electrode 5 and the extraction electrode 7.

In the above construction, by applying the reverse bias voltage $V_d$ to the Schottky diode, the avalanche amplification occurs at the interface between the p type semiconductor region 4 and the Schottky electrode 5. The resultant produced hot electrons pass through the Schottky electrode 5 formed extremely thinnly and are ejected out to a vacuum region and are extracted to the outside of the device by the electric field by the extraction electrode 7. As mentioned above, according to the embodiment, since ΔE is increased by the reverse bias voltage, it is possible to select an arbitrary material from the foregoing wide range as a low work function material without being limited to Cs, Cs—O, or the like and the more stable material can be used. On the other hand, since the electron emitting surface is constructed as the Schottky electrode of the low work function material, the process to form the surface electrode is simplified. The semiconductor electron emitting device of the good reliability and good stability can be manufactured.

Figure 2:
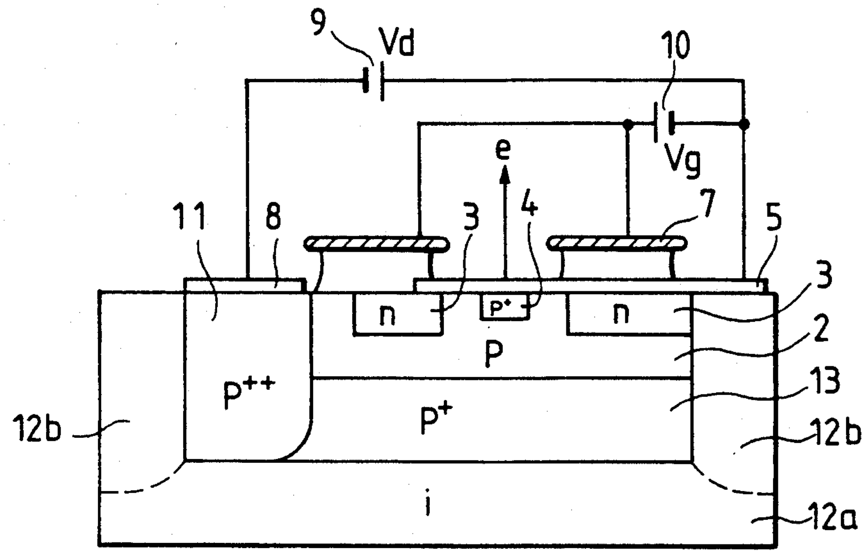
FIG. 2 is a schematic arrangement diagram of the second embodiment of a semiconductor electron emitting device of the invention.
Figure 4:
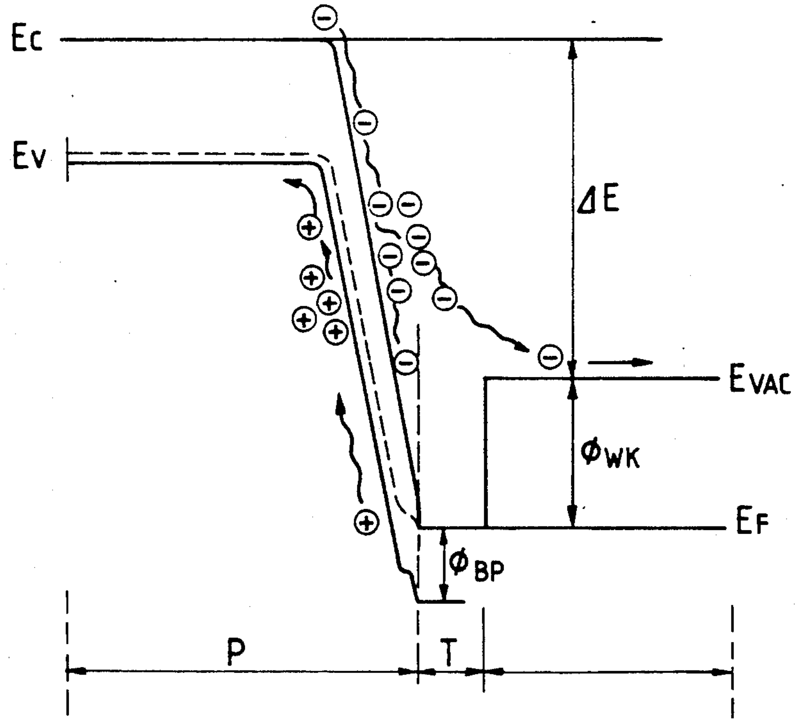
FIG. 4 is an energy band diagram of the semiconductor surface in the semiconductor electron emitting device of the invention.

FIG. 2 is a schematic arrangement diagram of the second embodiment of the semiconductor electron emitting device of the invention.

The second embodiment is constructed to prevent the crosstalk between the semiconductor electron emitting devices of the first embodiment.

In the second embodiment, $Al_{0.5}Ga_{0.5}As$ (Eg is set to about 1.9) is used to raise the electron emitting efficiency.

As shown in FIG. 2, a $p^+$ layer 13 of $Al_{0.5}Ga_{0.5}As$ is epitaxially grown while doping Be ions of $10^{18}$ ($cm^{-3}$) into a semiinsulative substrate **12*a* of GaAs (100). Next, the p layer 2** of $Al_{0.5}Ga_{0.5}As$ is epitaxially grown while doping Be ions of $10^{16}$ ($cm^{-3}$).

Then, Be ions are implanted into the deep layer by using an energy of about 180 keV by an FIB (focused ion beam) until an impurity concentration of a $p^{++}$ layer 11 is set to $10^{19}$ ($cm^{-3}$). Be ions are implanted into the relatively thin layer by about 40 keV until an impurity concentration of the p layer 4 is set to $5\times10^{17}$ ($cm^{-3}$). Further, Si ions are implanted by about 60 keV until an impurity concentration of the n layer 3 is set to $10^{18}$ ($cm^{-3}$). On the other hand, protons or boron ions are implanted by an accelerating voltage of 200 keV or higher, thereby forming a device separating region **12*b***.

Next, the annealing process is executed at 800° C. for 30 minutes in the air current of arsine $+N_2+H_2$ and a proper masking process is executed. Thereafter, $BaB_6$ ($\phi_{Wk}$=3.4 eV) is evaporation deposited until a thickness of about 100 Å and annealed at a temperature of 600° C. for 30 minutes, thereby forming the Schottky electrode 5. In a manner similar to the case of the first embodiment shown in FIGS. 1A and 1B, the extraction electrode 7 is formed and the surface oxidation treatment is finally executed to oxidize ⅓ of the surface of $BaB_6$, thereby forming BaO ($\phi_{Wk}$=1.8). At this time, the barrier height $\phi_{Bp}$ is 0.9V and the good Schottky characteristic is obtained. The semiconductor electron emitting device which can have a current density higher than that in the case of Si is derived.

According to the embodiment mentioned above, by insulating the devices, in the case of forming a number of semiconductor electron emitting devices onto the substrate, the crosstalks between the devices can be reduced and each device can be independently driven. On the other hand, by using a wide gap compound semiconductor as a semiconductor and by using boride as the surface, a good Schottky electrode in which the adhesive property is extremely good, the work function is low, and the Schottky barrier is large is formed, and the electron emitting efficiency can be increased.

Figure 3A:
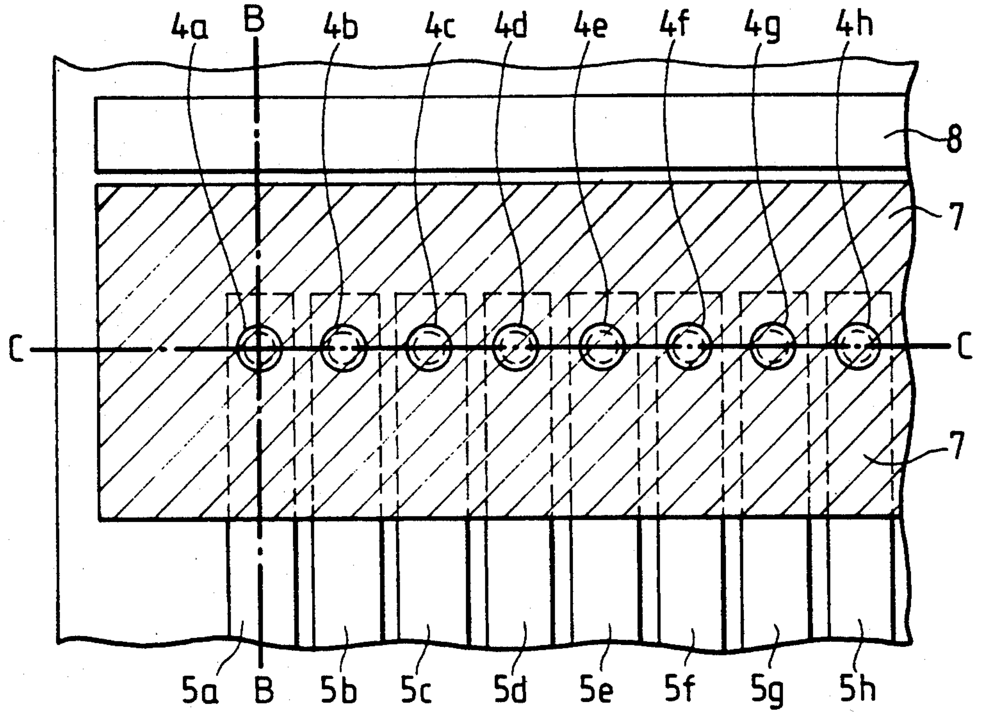
FIGS. 3A and 3B are schematic arrangement diagrams in the case where a number of semiconductor electron emitting devices in the second embodiment are formed in a line.
Figure 3B:
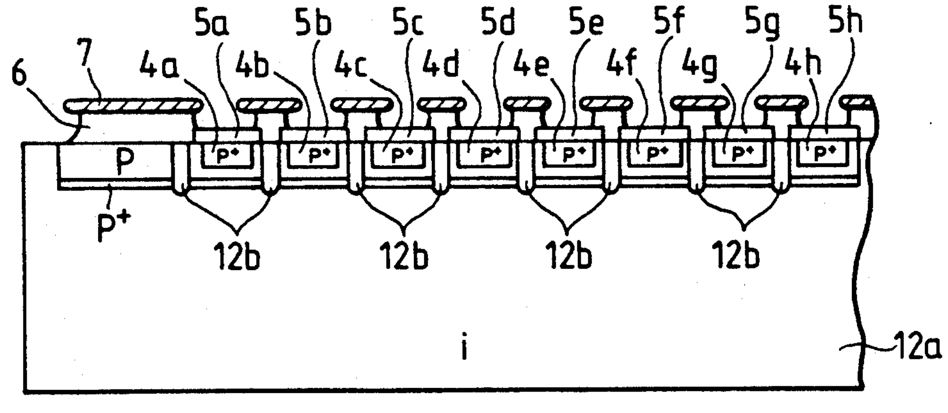

FIGS. 3A and 3B are schematic arrangement diagrams in the case where a number of semiconductor electron emitting devices of the second embodiment are formed in a line. FIG. 3A is a plan view and FIG. 3B is a cross sectional view taken along the line C—C in FIG. 3A.

A cross sectional view taken along the line B—B in FIG. 3A is the same as that in the second embodiment shown in FIG. 2. On the other hand, since a construction of the semiconductor electron emitting device is similar to that of the second embodiment, its detailed descriptions are omitted.

As shown in FIGS. 3A and 3B, $p^+$ layers 4*a* to 4*h*, Schottky electrodes 5*a* to 5*h*, and the device separating regions 12*b* are individually formed in and on the semiinsulative GaAs (100) substrate 12*a* by the ion implantation process.

In the above construction, a number of semiconductor electron emitting devices as shown by 4*a* to 4*h* are formed in a line in the electron emitting portions. By individually applying the reverse biases to a number of electrodes as indicated by 5*a* to 5*h*, each electron source can be independently controlled.

EFFECTS OF THE EMBODIMENTS

As described above in detail, according to the semiconductor electron emitting devices of the embodiments, the Schottky diode is formed by joining the Schottky electrode to the p type semiconductor, and the junction of the diode is reversely biased. Thus, the vacuum level $E_{VAC}$ can be set to an energy level lower than the conduction band $E_C$ of the p type semiconductor. An energy difference $\Delta E$ larger than that in the conventional device can be easily obtained. Further, by causing the avalanche amplification, a number of electrons as the minority carriers are generated in the p type semiconductor and the emission current is increased. Further, by changing the electrons to the hot electrons by applying a high electric field to the thin depletion layer, the electrons can be easily extracted into the vacuum.

On the other hand, since the material whose work function $\phi_{Wk}$ is larger than that in the case of cesium or the like can be used as the Schottky electrode material, a selecting range of the surface material is remarkably widened than the conventional case. A large electron emitting efficiency can be accomplished by using the stable material.

On the other hand, in the manufacturing of the semiconductor electron emitting device, the conventional semiconductor forming technique and thin film forming technique can be used. Therefore, there is an advantage such that the semiconductor electron emitting device of the invention can be cheaply manufactured at a high precision by using the existing techniques, or the like.

The semiconductor electron emitting device of the invention is preferably used in a display, an EB drawing apparatus, a vacuum tube and can be also applied to an electron beam printer, a memory, and the like.

What is claimed is:

1. A semiconductor electron emitting device comprising:
   - a Schottky electrode; and
   - a p type semiconductor, wherein said Schottky electrode is disposed on said p type semiconductor and defines a junction formed therebetween, wherein said p type semiconductor has an impurity concentration within a predetermined range adapted to cause an avalanche breakdown in response to a reverse bias voltage applied between said p type semiconductor and said Schottky electrode, and wherein electrons are emitted from said Schottky electrode in response to the application of the reverse bias voltage.

2. A device according to claim 1, wherein said Schottky electrode is made of a low work function material.

3. A device according to claim 1, wherein impurities of said p type semiconductor are implanted by a maskless ion implantation process.

4. A device according to claim 1 further comprising an extraction electrode for accelerating the electrons emitted from said Schottky electrode.

5. A device according to claim 4, wherein said extraction electrode comprises a circular aperture positioned on a central axis.

6. A device according to claim 2 further comprising an extraction electrode for accelerating electrons emitted from said Schottky electrode.

7. A device according to claim 6, wherein said extraction electrode comprises a circular aperture positioned on a central axis.

8. A semiconductor electron emitting device comprising a plurality Schottky electrodes and a plurality of p type semiconductors, wherein each of said Schottky electrodes is disposed on a respective one of said p type semiconductors and each defines a junction formed therebetween, wherein said plurality of p type semiconductors are provided on a common substrate, wherein an avalanche breakdown is caused in response to applying a reverse bias voltage between one of said Schottky electrodes and a corresponding one said p type semiconductors, and wherein each of said Schottky electrodes and a corresponding one of said p type semiconductors define an electron emission section.

9. A device according to claim 8, wherein each of said p type semiconductors has an impurity concentration in a predetermined range adapted to cause the avalanche break down in response to the application of the reverse bias voltage between each of said p type semiconductors and said corresponding one of said Schottky electrodes.

10. A device according to claim 8, further comprising a plurality of extraction electrodes for accelerating an electrons emitted from a respective one of said Schottky electrodes.

11. A device according to claim 10, wherein each of said extraction electrodes has a circular aperture positioned on a corresponding central axis.

12. A device according to claim 11, wherein said electron emission sections are arranged in a line.

13. A device according to claim 11, wherein one electron emission section is isolated from another electron emission section by an element isolation region.

14. A device according to claim 11, wherein said element isolation region is formed by an ion implantation.

15. A device according to claim 12, wherein one electron emission section is isolated from another electron emission section by an element isolation region.

16. A device according to claim 15, wherein said element isolation region is formed by an ion implantation.

* * * * *

UNITED STATES PATENT AND TRADEMARK OFFICE
CERTIFICATE OF CORRECTION

PATENT NO. : 5,138,402
DATED : August 11, 1992
INVENTOR(S) : Takeo Tsukamoto, et al It is certified that error appears in the above-indentified patent and that said Letters Patent is hereby corrected as shown below:

On the title page: Item [56] Reference Cited

Under Attorney, Agent, or Firm: "Fitzpatrick, Cella Harper & Scinto" should read --Fitzpatrick, Cella, Harper & Scinto--.

COLUMN 2

Line 22, "monority" should read --minority--.

COLUMN 6

Line 56, "break down" should read --breakdown--.
Line 61, "an" should be deleted.

Signed and Sealed this

Fourteenth Day of September, 1993

Attest:

BRUCE LEHMAN

Attesting Officer

Commissioner of Patents and Trademarks